United States Patent
Topliss et al.

(10) Patent No.: US 7,161,279 B2
(45) Date of Patent: Jan. 9, 2007

(54) CURVED ELECTRO-ACTIVE ACTUATORS

(75) Inventors: Richard Topliss, Cambridge (GB); Neel Bhalsod, Cambridge (GB); Mark Richard Shepherd, Hertfordshire (GB)

(73) Assignee: 1... Limited, Cambridge (GB)

( * ) Notice: Subject to any disclaimer, the term of this patent is extended or adjusted under 35 U.S.C. 154(b) by 189 days.

(21) Appl. No.: 10/494,138

(22) PCT Filed: Oct. 30, 2002

(86) PCT No.: PCT/GB02/04877

§ 371 (c)(1),
(2), (4) Date: Dec. 7, 2004

(87) PCT Pub. No.: WO03/038920

PCT Pub. Date: May 8, 2003

(65) Prior Publication Data
US 2005/0073218 A1   Apr. 7, 2005

(30) Foreign Application Priority Data
Nov. 2, 2001 (GB) ............................... 0126372.2

(51) Int. Cl.
*H01L 41/08* (2006.01)
(52) U.S. Cl. ..................... 310/330; 310/369
(58) Field of Classification Search ............ 310/330, 310/331, 367–369
See application file for complete search history.

(56) References Cited

U.S. PATENT DOCUMENTS

| 4,638,206 | A | | 1/1987 | Shogo et al. |
| 5,102,236 | A | * | 4/1992 | Ide .............................. 384/103 |
| 6,107,726 | A | * | 8/2000 | Near et al. ................... 310/328 |
| 6,161,270 | A | * | 12/2000 | Ghosh et al. ............... 29/25.35 |
| 6,820,313 | B1 | * | 11/2004 | Gauchet ..................... 29/25.35 |
| 6,979,937 | B1 | * | 12/2005 | Masters et al. ............. 310/332 |
| 7,005,781 | B1 | * | 2/2006 | Smits ......................... 310/331 |
| 2005/0253487 | A1 | * | 11/2005 | Allan et al. ................. 310/331 |

FOREIGN PATENT DOCUMENTS

| EP | 0 550 829 A | 2/1998 |
| WO | WO 98 07183 A | 7/1993 |

* cited by examiner

*Primary Examiner*—Thomas M. Dougherty
(74) *Attorney, Agent, or Firm*—Elman Technology Law, P.C.; Gerry J. Elman (57) ABSTRACT

Electro-active actuators (310) and methods of manufacturing such actuators are described with such actuators (310) having a plurality of electro-active segments (311) arranged along a curved line with each segment (311) being essentially planar and coupled to adjacent segments (311) through joint sections (312) placed at opposite corners of the segment (311). The actuators (310) exhibit a displacement in a different direction than the direction of displacement of a segment when seen in isolation. They can be made from a continuous tape of material, preferably by die punching.

9 Claims, 7 Drawing Sheets

CURVED ELECTRO-ACTIVE ACTUATORS

FIELD OF THE INVENTION

This invention relates to curved elements of electro-active material. More particularly, the invention related to electro-active actuators displaying a translational movement when energized.

BACKGROUND OF THE INVENTION

Electro-active materials are materials that deform or change their dimensions in response to applied electrical conditions or, vice versa, have electrical properties that change in response to applied mechanical forces. The best known and most used type of electro-active material is piezoelectric material, but other types of electro-active material include electrostrictive and piezoresistive material.

Many devices that make use of electro-active materials are known. The simplest piezoelectric device is a block of pre-poled, i.e., pre-oriented, piezoelectric material activated in an expansion-contraction mode by applying an activation voltage in direction of the poling.

Because piezoelectric devices are capacitive in nature, they exhibit a number of desirable mechanical and electrical characteristics. They have a very efficient coupling of energy from applied charge to mechanical strain, leading to a high bandwidth, a large force output and negligible resistive heating. Due to their capacitive nature, these devices draw their least current at zero rate of displacement. The stiffness of electro-active devices is determined by the electro-active material, which in general is crystalline, ceramic or polymer-based. However, as the electro-active effects are extremely small, e.g. in the order of 1 nm/V, the change in dimensions is relatively small and requires high voltages. Therefore, more complicated electro-active structures have been developed to achieve larger displacements.

To increase the displacements, several designs have been introduced such as stacks, unimorph or bimnorph benders, recurved benders, corrugated benders, spiral or helical designs.

For example, piezoelectric multilayer stacks can be fabricated by joining multiple piezoelectric rings or plates, such that the total displacement of the stack is the sum of the displacements of each individual plate. Inner electrodes separate adjacent plates. The stacks provide vertical displacement in accordance with their piezoelectric charge coefficients and the potential applied. Several hundred plates are necessary to provide total displacements of 10 or more micron.

A standard unimorph bender is made up of a flat piezoelectric strip bonded to a metallic shim from one side. Elongation of the strip when voltage is applied, forces the unimorph bender into a bent or curved shape. To increase the displacement range, the bimorph structures, mostly cantilevers-type structures, utilize two laminated piezoelectric layers, thus having two internal external electrodes to which voltages of opposite polarisation is applied. The application of an electric field across the two outer layers causes one layer to expand while the other contracts. This results in a bending motion with relatively wide displacements at the tip of the cantilever beam. In a cantilever configuration, the displacement of the tip is related to the length of the cantilever the applied voltage and the thickness of the cantilever. Cantilever-based piezoelectric actuators require lengths on the order of 25 mm or more to achieve a free deflection of 0.3 mm. It should be noted that a reinforced bimorph, i.e., a bimorph having a centre shim actually consists of nine layers: two piezo-ceramic layers, four electrode layers, two adhesive layers and the centre shim.

To further increase the maximum displacement of piezo-electric benders, it is known to form stacks and leveraged stacks, chains or extended sheets of benders. Such devices are described for example in the U.S. Pat. Nos. 3,816,774; 4,028,666; 5410,207 and 6,107,726. Stacked recurved actuator designs are described by J. D. Ervin and D. Brei in: "Recurve Piezoelectric-Strain-Ampliying Actuator Architecture", IEEE/ASME Transactions on Mechatronics, Vol. 3, No.4, December 1998, 293–301.

Benders, stacks, tubes and other electro-active actuators are employed in a wide array of engineering systems, ranging from mnicro-positioning applications and acoustic wave processing to printing applications. Generally, actuators are used in such applications to generate force and effect displacement, for example, to move levers or other force transmitting devices, pistons or diaphragms, to accurately position components, or to enable similar system functions. Actuators employed for such functions typically are designed to provide a desired actuation displacement or stroke over which a desired force is delivered to a given load.

Depending upon design, electro-active actuators can generate a rotational or translational displacements or combinations of both movements.

Comparably large translation displacements have been recently achieved by using a helical structure of coiled piezoelectric tape. Such twice-coiled devices are found to easily exhibit displacement in the order of millimetres on an active length of the order of centimetres.

Whilst the piling of simple discs or blocks into stacks of electro-active material to achieve a cumulative change of dimension is a comparatively mature technique, it remains a very difficult task to join benders to stacks or to produce helices.

Therefore, it is an object of the present invention to provide novel configurations of electro-active material that—whilst maintaining similar performance than stacks of benders or twice-coiled benders—are easier to manufacture.

SUMMARY OF THE INVENTION

In view of the above objects, the present invention provides apparatus and methods as claimed in the independent claims.

According to a first aspect of the invention, there is provided a chain of electro-active segments linked by linkage members or elements. The chain of segments is bent along a non-straight, curved line or contour of uniform or non-uniform curvature, so as to form for example an arc, or a part of a circle, an ellipse, a spiral, a helix or the like.

Each of segments is thin or two-dimensional, i.e., its width and/or length exceeds its thickness by at least one order of magnitude. Whilst a first of the segments is typically fixed to an immobile support structure, for example a housing, linkage elements or joints bridging the gap between the abutting edges of adjacent segments provide a force-transmitting coupling of subsequent segments. The joints are alternately positioned such that a segment linked at a proximate edge or corner to a preceding segment is linked to a succeeding segment at its distal edge or corner. Effectively, the joints transfer the displacement of the distal edge of one segment to the proximate edge of the subsequent segment. Thus, the displacement of the end of one segment translates into off-setting the base of the following segment and, in fact, of the remaining chain of segments.

While in principle any bender of electro-active material could be used in the inventive actuator, the segments are preferably bimorphs to increase the available amount of deflection per volt applied.

If the curvature of the bimorphs alternates between negative and positive curvature, i.e., between convex and concave, the chain of segments can be designed such that the net effect is a cumulative large translational displacement between the first and the last segment of the chain in a direction out of the plane of the curved line along which the successive segments are arranged.

As the chain of segments follows an arc or a similar curved path, the actuator has a centre opening. This opening can be advantageously used for translational movements of components that require edge-mounting, such as lenses.

The devices can be assembled segment by segment using for example metallic or plastic linkage elements and suitable adhesives to join adjacent segments. However, the invention also provides a method of manufacturing the actuators described above using green tapes or sheets or electro-active material. Devices in accordance with the present invention can be thus manufactured by applying a pattern of cuts to such a tape or sheet resulting in segments and linkage being effectively one continuous electro-active device with no hetero-material placed between the segments.

The tape used is preferably very thin. By using thin tape with a thickness below 50 micron or even below 25 micron, the amount of voltage required to operate the device can be significantly reduced. For applications in which the amount of force generated rather than maximum voltage is the most important design consideration, tapes with a thickness of up to 1 mm or even higher may be used.

In a preferred method, two concentric arcs or circles are cut or punched into a sheet of electro-active material together with a set of radial cuts alternately starting from the outer and inner arc or circle and, whilst extending beyond the middle line between the two arcs, not cutting through the opposite arc, thus leaving linkage elements of electro-active material between the segments so generated. In another preferred method, a tape is cut from opposite edges in a comb-like manner and then bent into the desired shape of the actuator. The first method results in a disk-like actuator whilst the second method can be advantageously used to manufacture a ring-like or cylindrical device.

Electro-active materials for use in the present invention are preferably piezoelectric materials such as PZT.

These and other aspects of inventions will be apparent from the following detailed description of non-limitative examples making reference to the following drawings.

DETAILED DESCRIPTION

As the invention relates to novel configurations of benders, particularly bimorph benders, the general properties of bimorph benders are described before referring to examples of configurations in accordance with the present invention.

Figure 1A:
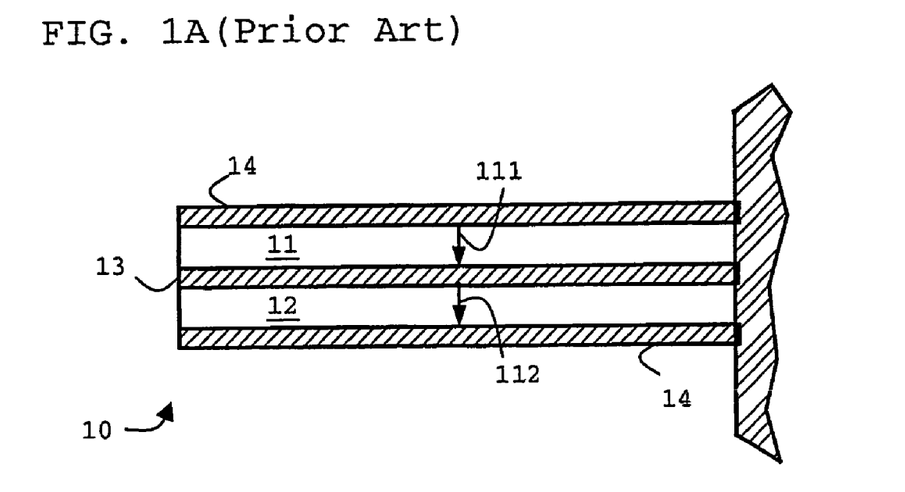
FIG. 1A is a schematic side elevation of a known bimorph bender.

Referring initially to FIG. 1A, a typical bimorph 10 includes a pair of piezoelectric or piezo-ceramic plates 11 and 12, which may be elongated and are interposed between an inner electrode 13 or electrically conductive shim and outer electrodes 14. Further, the piezo-ceramic elements or plates 11 and 12 are shown electrically poled or polarized in a common direction, as represented by the arrows 111 and 121, respectively.

Figure 1B:
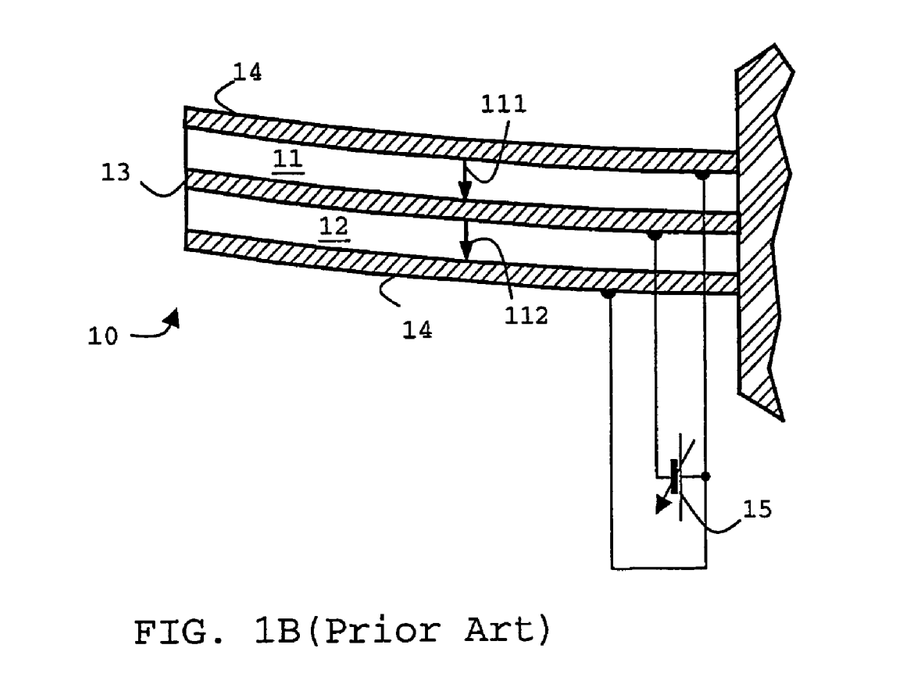
FIG. 1B a schematic side elevation similar to that of FIG. 1A, but illustrating the deflection of the bimorph bender when a drive or deflection voltage is applied thereto.

When an electrical potential or voltage from a source 15 is applied across each of the piezo-ceramic elements 11 and 12, for example, between outer and inner electrodes 14, 13, as shown on FIG. 1B, the element or plate 11 contracts and element or plate 12 expands, so that bimorph cantilever 10 bends in the direction perpendicular to its longitudinal axis. The absolute displacement depends on the strength of the electric voltage applied to the bender and its material properties. If the polarity of the voltage applied from source 15 to bimorph leaf 10 is reversed, the direction of bending of the leaf will be opposite to that shown on FIG. 1B.

Figure 2:
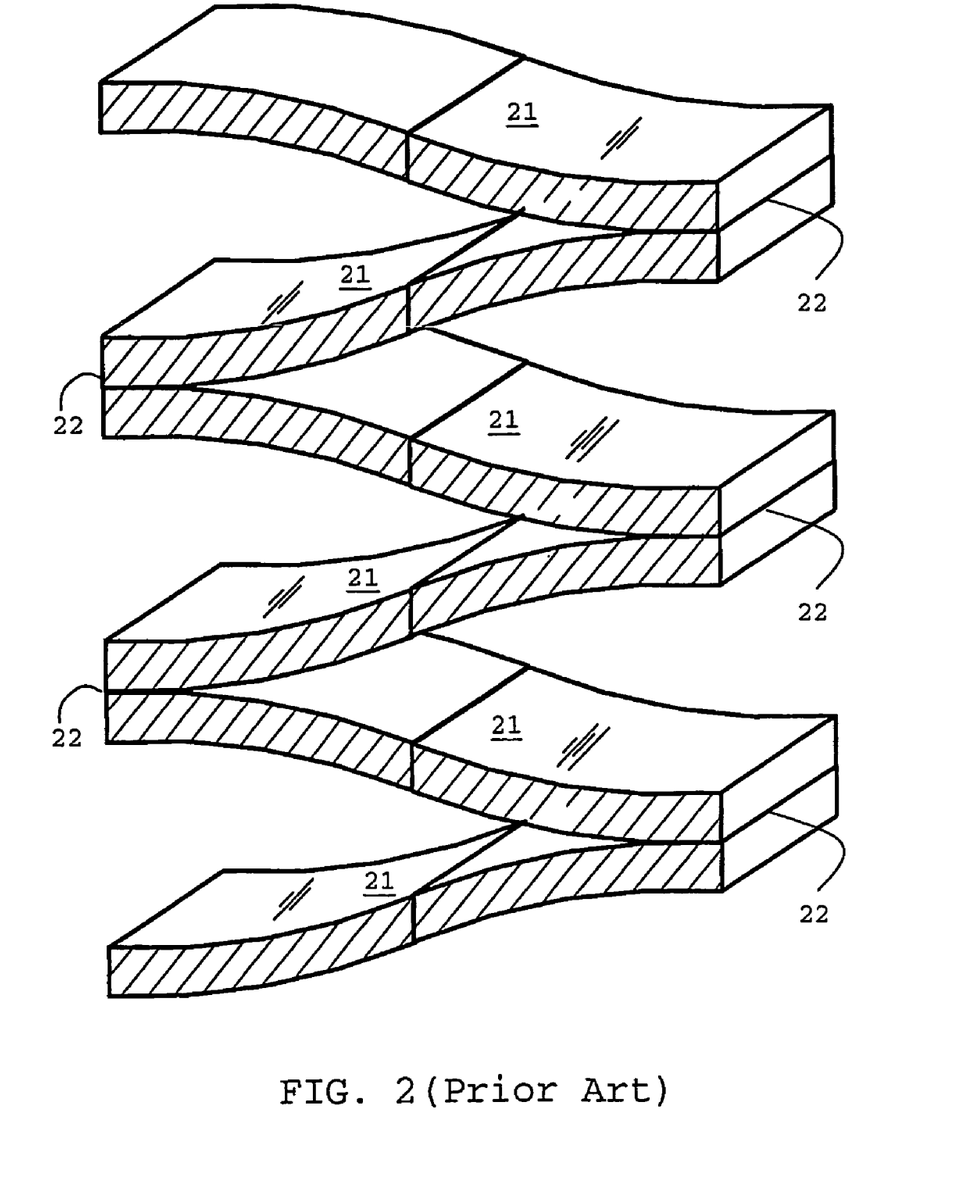
FIG. 2 is a schematic perspective view of a stack of recurved bimorph benders according to the prior art.

Referring now to FIG. 2, a known technique to stack benders is illustrated. The individual benders 21 are of the recurved type cantilevers as described for example by J. D. Ervin and D. Brei in: "Recurve Piezoelectric-Strain-Amplifying Actuator Architecture", IEE/ASME Transactions on Mechatronics, Vol. 3, No.4, December 1998, 293–301. The benders are joined via joint sections 22 with the major face of each bender facing one another. The joint are described to include layers of epoxy adhesive with metal end caps (not shown).

The displacement of each bender 21 adds to the overall displacement of the stack and, in principle, any amount of displacement can be achieved stacking benders in sufficient number. However, to stack ceramic material is a difficult task and, while accomplished with stacks of simple disks piezoelectric material, stacks of benders 21 manufactured on as commercial products are rare. The difficulties arise mainly out of the need to laminate or bond a plurality of heterogeneous layers at the joint sections 22.

The invention, therefore, provides multiple-bender configurations where the electroding and laminating of the benders can be performed on a flat layer of electro-active material. It will be appreciated by those skilled in the art that the problems usually associated with the manufacture of complex ceramic structures are thus greatly reduced.

Figure 3A:
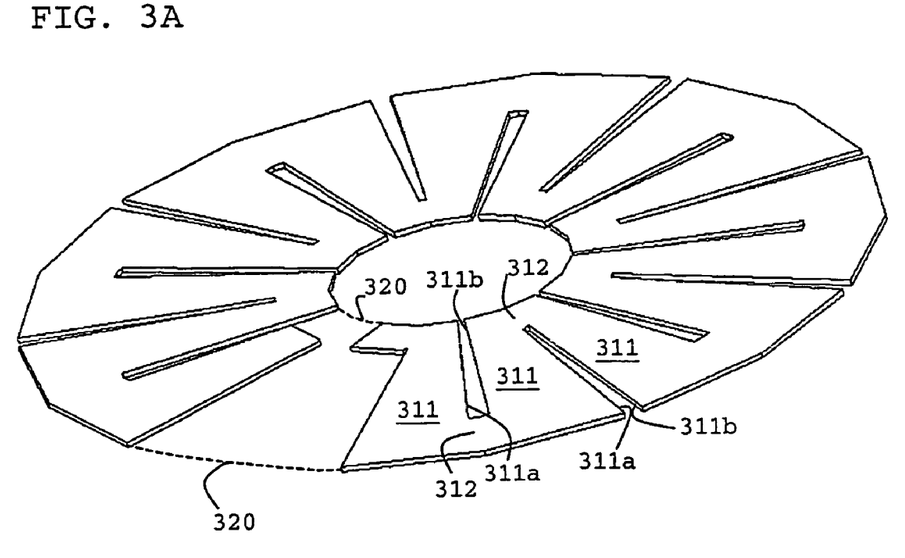
FIG. 3A is a schematic perspective view of an actuator in accordance with a first example of the invention.

A first embodiment of the invention is described making reference to FIG. 3A, which shows an open ring or disk 310 of sixteen piezoelectric segments 311. For clarity, dotted lines 320 are drawn to close the ring indicative of the flat shape the actuator 310 resumes in its rest state. The first three of the sixteen segments 311 are labelled to clarify relationships between adjacent segments 311. Each segment 311 is an essentially flat rectangular bimorph bender of lead zirconate titanate (PZT). As such, the segments 311 are arranged to bend in a direction perpendicular to the faces of the segments 311. It will be appreciated that other shapes and electro-active materials could be used. For example, other bender structures comprising a plurality of layers arranged to create bending perpendicular to the layers could be used.

As illustrated, the segments 311 are preferably of uniform size and shape. However, as this preference is mainly motivated by the resulting ease of manufacturing, other design considerations may lead to the use of two or more different types of segments.

Successive segments 311 are placed along an arc of a circle, essentially forming a part-disk with a centre opening. Segments 311 may be placed along other two- or three-dimensional curves such as ellipsoids, spirals or helices.

Each of the segments 311 (with the obvious exception of the first and the last segment) are linked to a preceding and succeeding segment 311 at lateral edges 311a and 311b. The lateral edges 311a and 311b of two adjacent segments 311 face each other, thus forming a narrow slit or gap. The chain segments are linked via joints 312. Each segment 31 is joined at a proximate corner and a distal corner to its adjacent neighbours. Thus the joints 312 along the distal edges 320 of the segments 311 and the joints along the proximate edges 320 of the segments 311 are arranged along respective curved lines which are parallel one another.

To take full advantage of the displacement of each of the segments 311, the joints are placed at the extreme ends of the segments 311 to increase the length of the slits or gaps between adjacent segments 311. On the other hand, the slits are designed with minimum width so that a maximum number of segments can be placed along a given length of chain 310.

In this embodiment, the joints 312 are formed of the same electro-active material as the segments 311, in fact, cut from the same sheet of base material. However, it is alternatively possible to have segments 311 joined via portions of heteromaterial such as metal or adhesives.

Figure 3B:
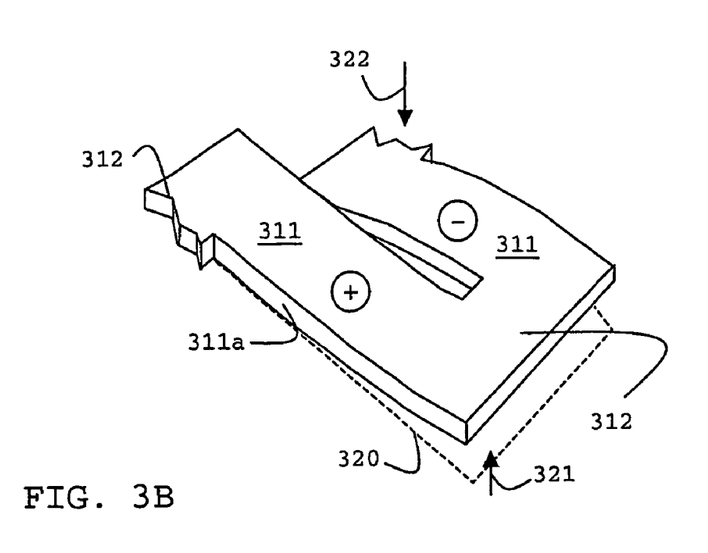
FIG. 3B is a detail view of the actuator of FIG. 3A.

Adjacent segments 311 display a different sense of curvatures when bending. When a voltage is applied, adjacent segments 311 bent as indicated in FIG. 3B, which shows two segments 311 of the actuator 310 of FIG. 3A. The dotted line 320 indicates where the first segment 311 is located when zero voltage is applied.

The segments 311 bend in the direction of the thickness and, hence, perpendicular to the face of the benders. The benders are arranged and actuated to alternately exhibit positive or negative curvatures of bending, as indicated in FIG. 3B by encircled "+" and "−", respectively.

Figure 3C:
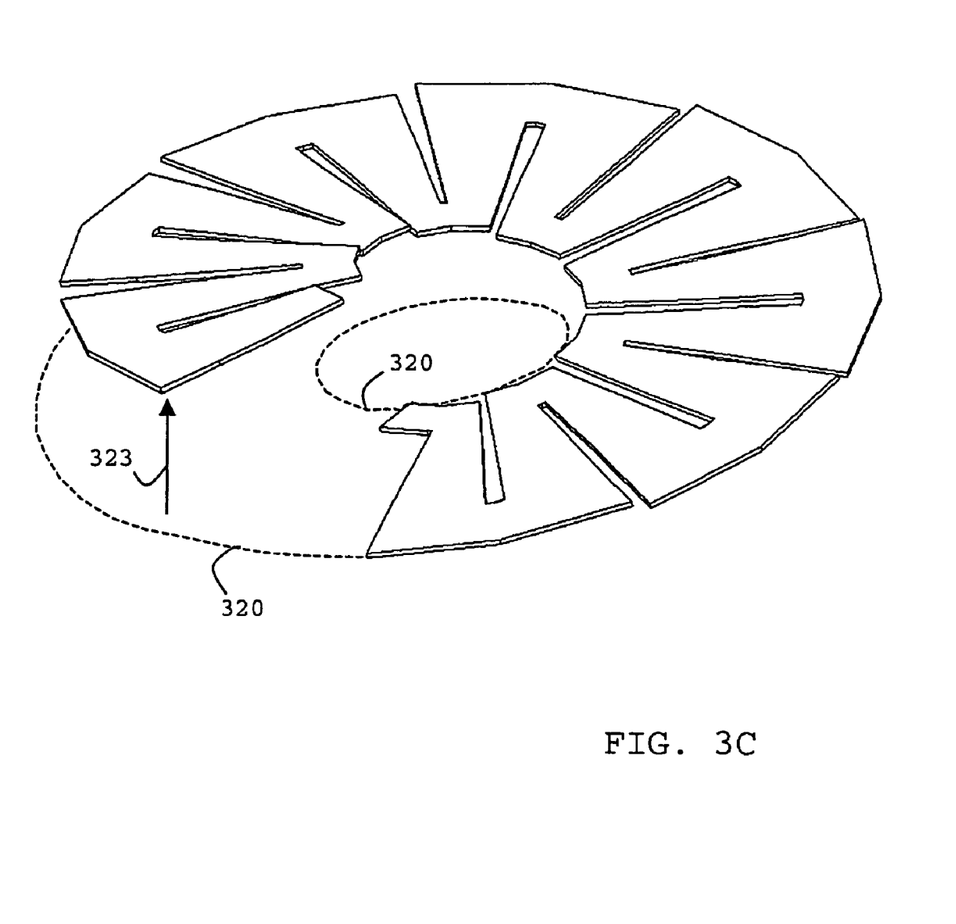
FIG. 3C is a schematic perspective view of an actuator similar to that of FIG. 3A, but illustrating the deflection of the actuator when a drive or deflection voltage is applied thereto.

The cumulative effect on the actuator is shown in FIG. 3C. Though each segment 311 basically exhibits the typical rotational bender motion, the sum of the all displacements along the curve the segments 311 are placed on results in a translational movement perpendicular to the main face of the actuator 310. One way to visualise the displacement is that the bending of successive segments 311 with alternate curvatures causes twisting of the actuator 310 around the curved line along which successive segments 311 are arranged, which twisting causes displacement of the actuator 310 out of the plane of the curved line. The arrow 323 indicates such cumulative displacement out of the plane defined by lines 320.

Figure 4A:
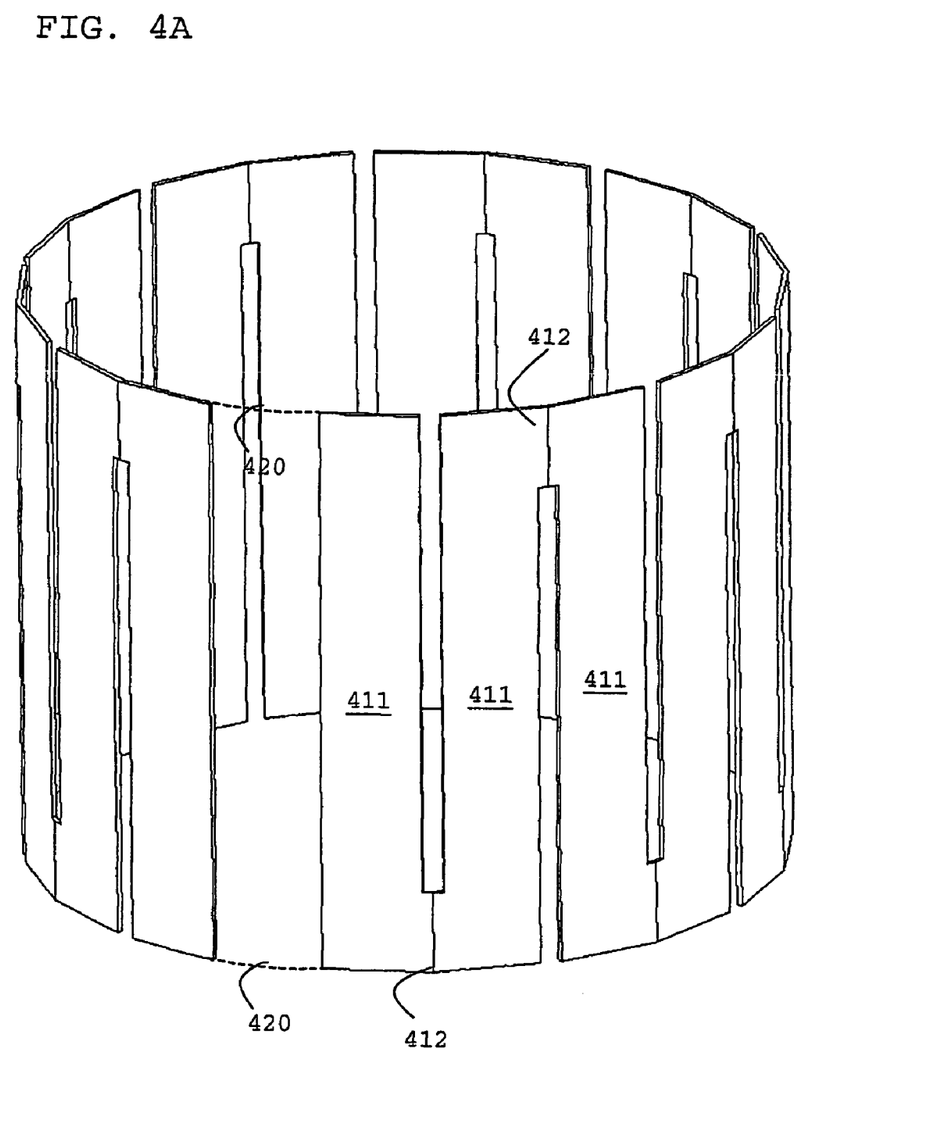
FIG. 4A is a schematic perspective view of an actuator in accordance with a second example of the invention.
Figure 4B:
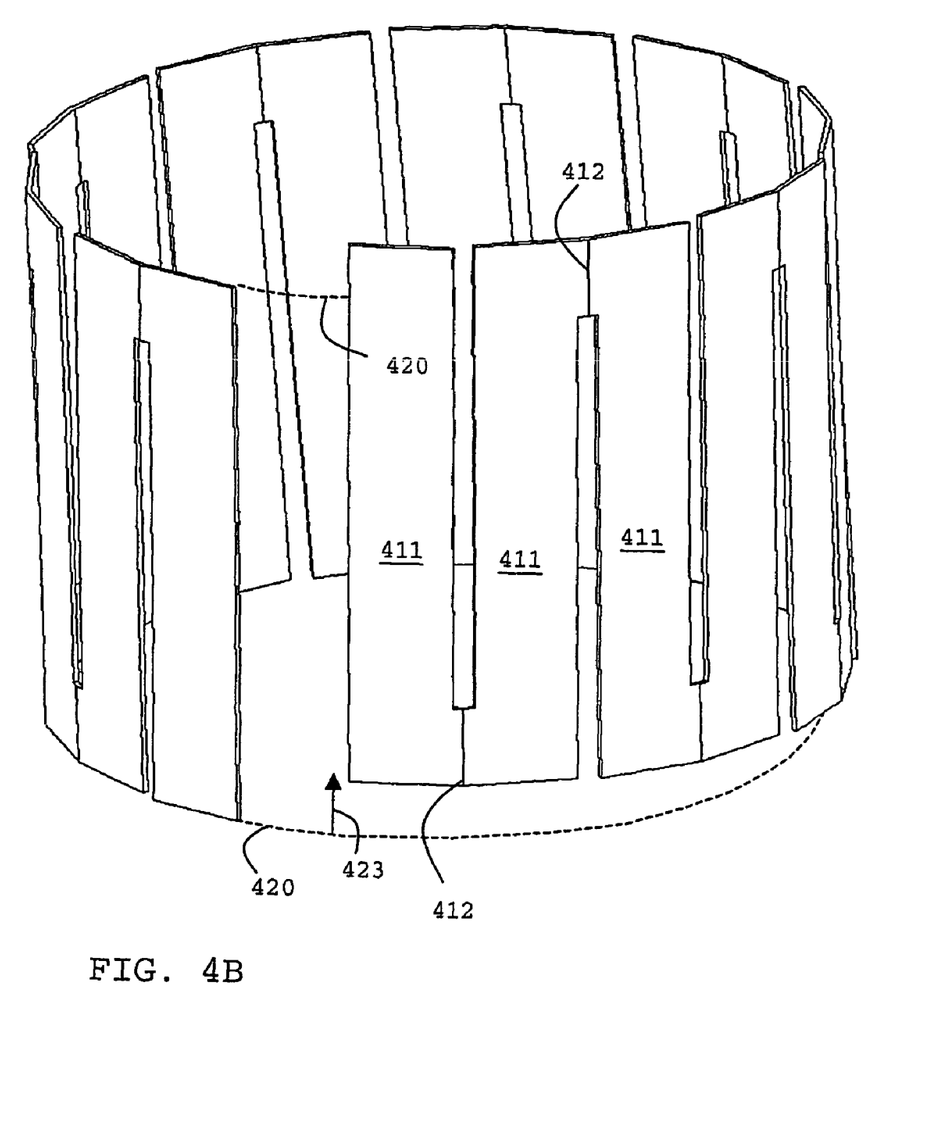
FIG. 4B is a schematic perspective view of an actuator similar to that of FIG. 4A, but illustrating the deflection of the actuator when a drive or deflection voltage is applied thereto.

Referring now to another embodiment of the invention, as shown in FIGS. 4A and 4B, an actuator 410 comprising a plurality of segments 411 of piezoelectric material arranged in a part circle and joined via bridge elements from the same material. This embodiment and the previously described embodiment of FIG. 3 differ in that the segments 411 are arranged parallel to the main axis of displacement giving the actuator 410 an essentially cylindrical shape. As above, dotted lines 420 indicate the base plane out of which the actuator bends when energized. The segments 411 when seen in isolation from their respective neighbours bend alternately towards or away from the centre of the cylinder defined by the arrangement of segments. An arrow 423 in FIG. 4B indicates the direction of the cumulative motion of the actuator 410 being essentially parallel to the main axis of this cylinder.

Figure 5:
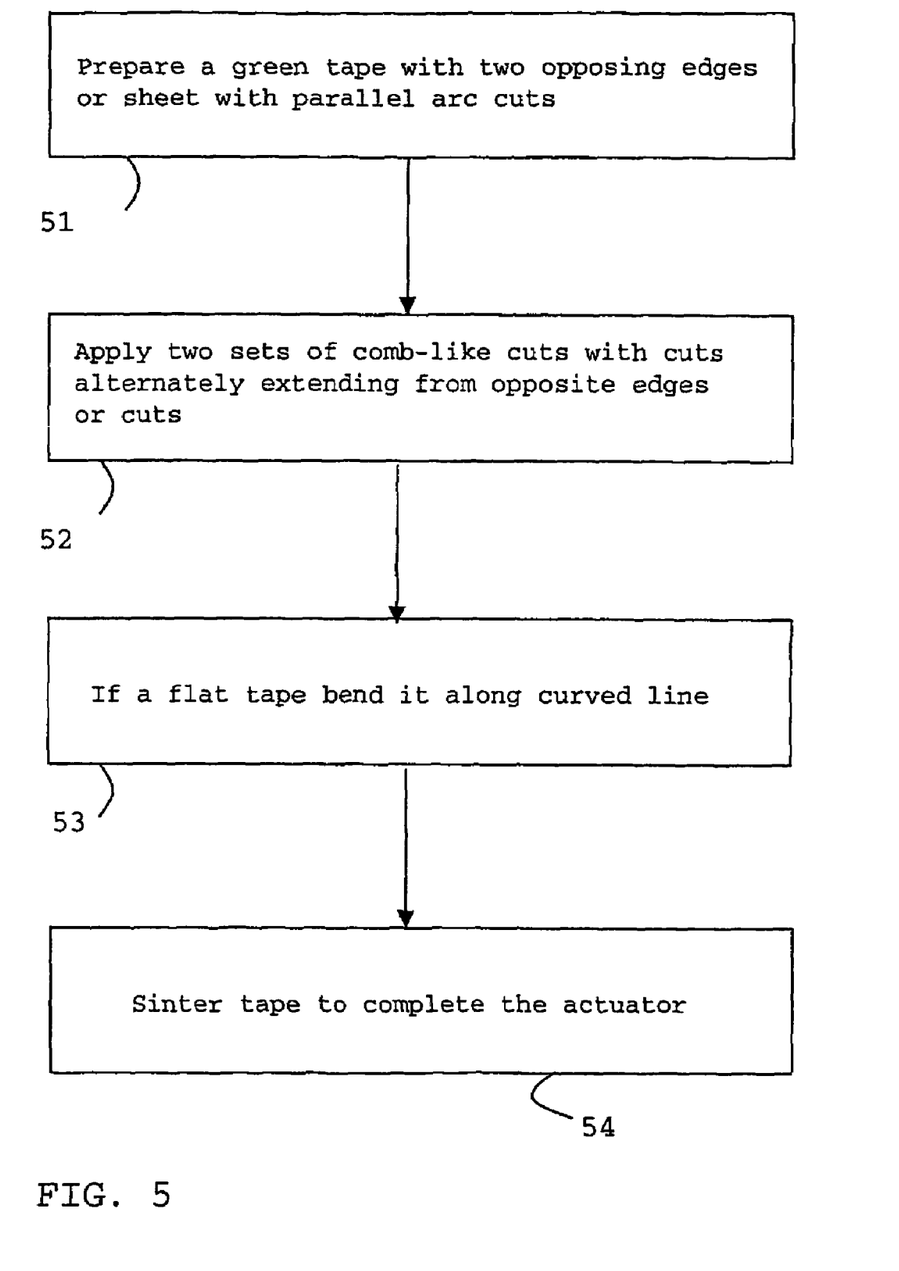
FIG. 5 is a flow chart illustrating steps of a method in accordance with the invention.

Making now reference to FIG. 5, a method of manufacturing the electro-active actuators according to the present invention is described.

As a first step 51 a sheet or tape of electro-active material is prepared using any of the known methods of making such sheets or tapes. Examples of such methods include tape casting, compaction, injection molding or co-extrusion. The latter two methods are, for example, described by C. Near et al. in: SPIE Vol. 3326, 323–331 and by A. T. Crumm et al. in: SPIE Vol. 3224 (March 1998), 20–27, respectively.

For example, in a typical tape casting process a slurry of PZT powder is prepared including the powder and solvent (on an alcoholic base), together with binders, plasticizers and dispersing agents. After ball-miling to ensure a complete de-agglomeration of its solid particles, sieving and degassing, the slurry is cast onto a polymer carrier. A system of Doctor blades is typically used to produce a tape of uniform thickness. After drying, this tape is in a state often referred to as "green" in the art.

The green tape is within limits flexible, compliant and can be easily cut using blades or any other cutting process 52, such as laser cutting. Because of its speed, a punch die process using a pre-formed die with sharp edges in accordance to the pattern to be cut from the tape or sheet is preferably employed to cut segments and links in a single step from the remaining material.

Electrodes are applied by a process known as screen-printing using an "ink" (paste) of platinum or silver palladium powder mixed with a binder and a solvent. After applying the paste, the tape is dried again at about 100 degrees Celsius. For a bimorph structure, two single layers are stacked and pressed at 70 degrees Celsius. At this stage 53, the tape is still compliant and can be formed into more three-dimensional shapes such as helices or spirals.

After applying the electrodes and the lamination, the tapes buned-out at 600 to 800 degrees Celsius to evaporate organic residues. And as a final step 54, the material is hardened or sintered at temperatures above 1000 degrees Celsius.

After sintering the devices are polarized applying a several hundred volts across the electrodes.

The above-described process can be varied with respect to compositions, binder and electrode material, temperatures etc. Also the electroding step may be set at a different stage within the process. However, these and other variants of the process are considered to be well within the scope of the present invention.

The invention claimed is:

1. An electro-active actuator comprising
a plurality of thin benders of electro-active material, each of said benders having a proximate edge and a distal edge opposite each other and first and second lateral edges opposite each other,
wherein
said benders are arranged successively along a curved line with said first lateral edge facing said second lateral edge of a preceding bender and said second lateral edge facing said first lateral edge of a succeeding bender, thus forming gaps between adjacent benders,
each pair of adjacent benders is linked by a force-transmitting joint, the force-transmitting joints being arranged alternately close to a said proximate edge and close to a said distal edge, and
the benders are alternately arranged to bend with opposite senses of curvature.

2. The actuator of claim 1, wherein the benders are flat, curved, corrugated or a combination thereof.

3. The actuator of claim 1, wherein the benders are arranged to form a central opening.

4. The actuator of claim 1, wherein the force-transmitting joints consist of said electro-active material.

5. The actuator of claim 1, wherein the segments and joints are formed from one continuous sheet of electro-active material.

6. The actuator of claim 1, wherein the force-transmitting joints consist of heteromaterial other than electro-active material.

7. The actuator of claim 1, wherein the benders are bimorph benders.

8. The actuator of claim 1, wherein said force-transmitting joints close to a said proximate edge are arranged along a proximate curved line and said force-transmitting joints close to a said distal edge are arranged along a distal curved line.

9. The actuator of claim 8, wherein said proximate curved line and said distal curved line are parallel.

* * * * *